United States Patent [19]
Watanabe et al.

[11] Patent Number: 5,710,442
[45] Date of Patent: Jan. 20, 1998

[54] SEMICONDUCTOR DEVICE AND METHOD OF MANUFACTURING SAME

[75] Inventors: Atsuo Watanabe, Hitachiohta; Katsuaki Saito, Hitachi, both of Japan

[73] Assignee: Hitachi, Ltd., Tokyo, Japan

[21] Appl. No.: 589,637

[22] Filed: Jan. 22, 1996

[30] Foreign Application Priority Data

Feb. 3, 1995 [JP] Japan .................. 7-16663

[51] Int. Cl.$^6$ .................. H01W 29/74; H01L 31/111
[52] U.S. Cl. .................. 257/107; 257/109; 257/165; 257/171; 257/169
[58] Field of Search .................. 257/107, 109, 257/137, 144, 150, 152, 154, 165, 169, 171

[56] References Cited

U.S. PATENT DOCUMENTS

| | | | |
|---|---|---|---|
| 3,564,357 | 2/1971 | Valcik | 257/171 |
| 4,236,169 | 11/1980 | Nakashima et al. | 257/171 |
| 4,292,646 | 9/1981 | Assour et al. | 257/171 |

FOREIGN PATENT DOCUMENTS

| | | | |
|---|---|---|---|
| 5124261 | 9/1980 | Japan | 257/171 |
| 58-128765 | 8/1983 | Japan . | |
| 1237468 | 10/1986 | Japan | 257/171 |

*Primary Examiner*—Tom Thomas
*Assistant Examiner*—Fetsum Abraham
*Attorney, Agent, or Firm*—Antonelli, Terry, Stout & Kraus, LLP

[57] ABSTRACT

A semiconductor device sets an impurity density of a p base layer in a bevel end-face region to a density lower than that in an operating region and has a parasitic channel preventive region provided between the bevel end-face region and the operating region. Since the blocking-voltage and the current-carrying capacity can be adjusted independently from each other, the blocking voltage and the current-carrying capacity can be both improved.

12 Claims, 9 Drawing Sheets

SEMICONDUCTOR DEVICE AND METHOD OF MANUFACTURING SAME

BACKGROUND OF THE INVENTION

The present invention relates to a semiconductor device and a method of manufacturing the semiconductor device, and particularly to a technique applied to and effective for a semiconductor device which provides a high blocking voltage and a large current.

A thyristor is a semiconductor device or element having a pnpn structure composed of a p emitter layer, an n base layer, a p base layer and n emitter layers. It is necessary to reduce the electric field strength at portions where pn junctions are exposed at the end faces of the device, in order to put the thyristor into a high blocking voltage state. Therefore, the impurity density of the p base layer is reduced. When the p base layer is reduced in density, the thyristor can be brought into the high blocking voltage state. However, the conduction region thereof is apt to mistrigger. It is thus difficult to obtain a device capable of providing a high blocking voltage and a large current while simultaneously optimizing the blocking-voltage characteristic and the characteristic of the conduction region.

Figure 14:
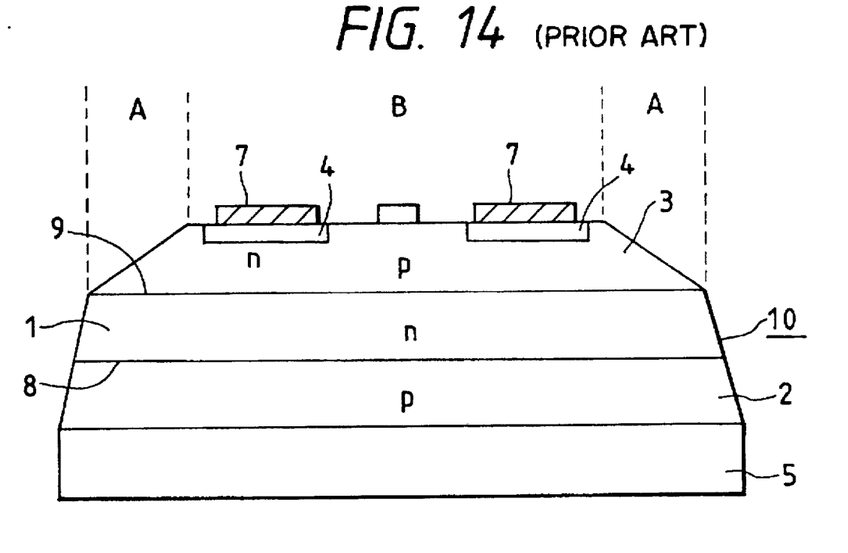
FIG. 14 is a sectional view of a semiconductor base substrate showing a structure of a conventional high blocking-voltage thyristor.

A sectional structure of a conventional high blocking-voltage thyristor for solving such a problem is shown in FIG. 14. This type of device has been described in JP-A-58-128765. In FIG. 14, a semiconductor base substrate 10 has a pnpn four-layer structure composed of an n base layer 1, a p emitter layer 2, a p base layer 3 and n emitter layers 4. An anode electrode 5 is formed over the entirety of one main surface of the p emitter layer 2. Each of the cathode electrodes 7 is formed on a main surface of the n emitter layer 4. Further, pn junctions 8 and 9 are exposed on side faces of the semiconductor base substrate 10. Each of the side faces has a shape inclined with respect to a pn-junction. This shape serves to reduce the electric field strength at the exposed surface of each pn junction and is generally called a "bevel structure." A region B of the semiconductor base substrate 10 corresponds to a thyristor region for causing a main current to flow between the anode electrode 5 and each of the cathode electrodes 7. Each of the regions A thereof corresponds to a junction end region at which the pn junction is exposed on the side face of the semiconductor base substrate.

Figure 15:
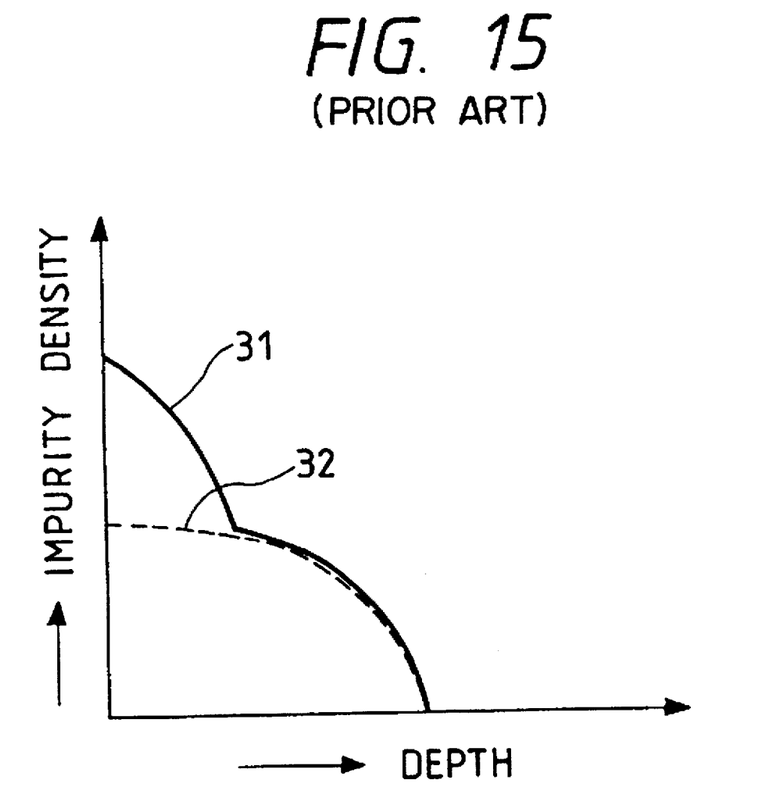
FIG. 15 is a graph for describing an impurity density distribution of a p base layer employed in the conventional high blocking-voltage thyristor shown in FIG. 14.

FIG. 15 illustrates an impurity density distribution of the p base layer 3 of the thyristor referred to above. A dotted line 32 shows an impurity density distribution obtained at each region A and a solid line 31 shows an impurity density distribution obtained at the region B. In the regions A associated with the blocking-voltage characteristic, the impurity density distribution of the p base layer 3 extends in the entire depth direction at a density lower than that at the region B and has a gentle gradient. Therefore, a depletion layer is easily expanded on the exposed surfaces of the pn junctions in each region A. Thus, the surface electric field strength can be reduced without varying the sensitivity of triggering at the region B.

In the conventional thyristor, since the injection efficiency of the n emitter increases in each region A with a reduction in the impurity density of the p base layer 3, the a current gain ($h_{FE}$) of an npn bipolar transistor section increases. Therefore, a thyristor portion including the regions A is apt to mistrigger because the sensitivity of triggering of the thyristor portion is increased. As a result, there is a limitation on increasing the blocking voltage of the thyristor with the reduction in impurity density of the p base layer 3 in the junction end regions.

SUMMARY OF THE INVENTION

A semiconductor device according to the present invention is provided with a semiconductor base substrate having a first semiconductor layer of a first conductivity type, a second semiconductor layer of a second conductivity type, a third semiconductor layer of said first conductivity type and a fourth semiconductor layer of said second conductivity type. A first main electrode is provided on the first semiconductor layer and a second main electrode is provided on the fourth semiconductor layer. The average impurity density of the third semiconductor layer in each of first regions adjacent to the ends of the semiconductor base substrate is smaller than that of the third semiconductor layer in a second region provided inside the first region. In the semiconductor device according to the present invention as well, the second main electrode makes contact with the third semiconductor layer between the first and second regions.

Further, a method of manufacturing the aforementioned semiconductor device, according to the present invention, comprises the following steps: a first step of diffusing a first impurity of the second conductivity type into a first conductivity type semiconductor substrate; a second step of eliminating the second conductivity type impurity layer provided at each of the peripheral regions of the semiconductor substrate in accordance with the first step; and a third step of implanting the semiconductor substrate with a second impurity of the second conductivity type.

According to the semiconductor device of the present invention, since the second main electrode is in contact with the third semiconductor layer between the first and second regions, the sensitivity of triggering of a thyristor portion in the first region is lowered. Thus, the impurity density of the third semiconductor layer in the first region or at each end of the semiconductor base substrate can be reduced so as to improve the blocking voltage of the thyristor portion without being restricted by mistriggering of the thyristor portion. Further, since the average impurity densities of the third semiconductor layers are made different from each other in the first regions adjacent to the ends of the semiconductor base substrate and the second region provided inside the first regions, which serves as a conduction region, the blocking-voltage characteristic and the characteristic of the conduction region can be improved by adjusting them independently. Accordingly, a high blocking voltage and a large current flow can be achieved simultaneously.

According to the method of the present invention, since an impurity of the second conductivity type is newly injected after the impurity layer of second conductivity type formed in each peripheral region of the semiconductor substrate in accordance with the first step has been removed, the average impurity densities of the second conductivity type semiconductor layers formed in the peripheral region and other regions of the semiconductor substrate can be made different from each other. Therefore, the third semiconductor layers employed in the semiconductor device according to the present invention can be formed. Thus, according to the method of the present invention, a; semiconductor device providing a high blocking voltage and a large current can be fabricated.

DESCRIPTION OF THE PREFERRED EMBODIMENTS

Embodiments of the present invention will hereinafter be described in detail with reference to the accompanying drawings. In all the drawings for describing the embodiments, elements, which have the same functions, are identified by like reference numerals.

(Embodiment 1)

Figure 1:
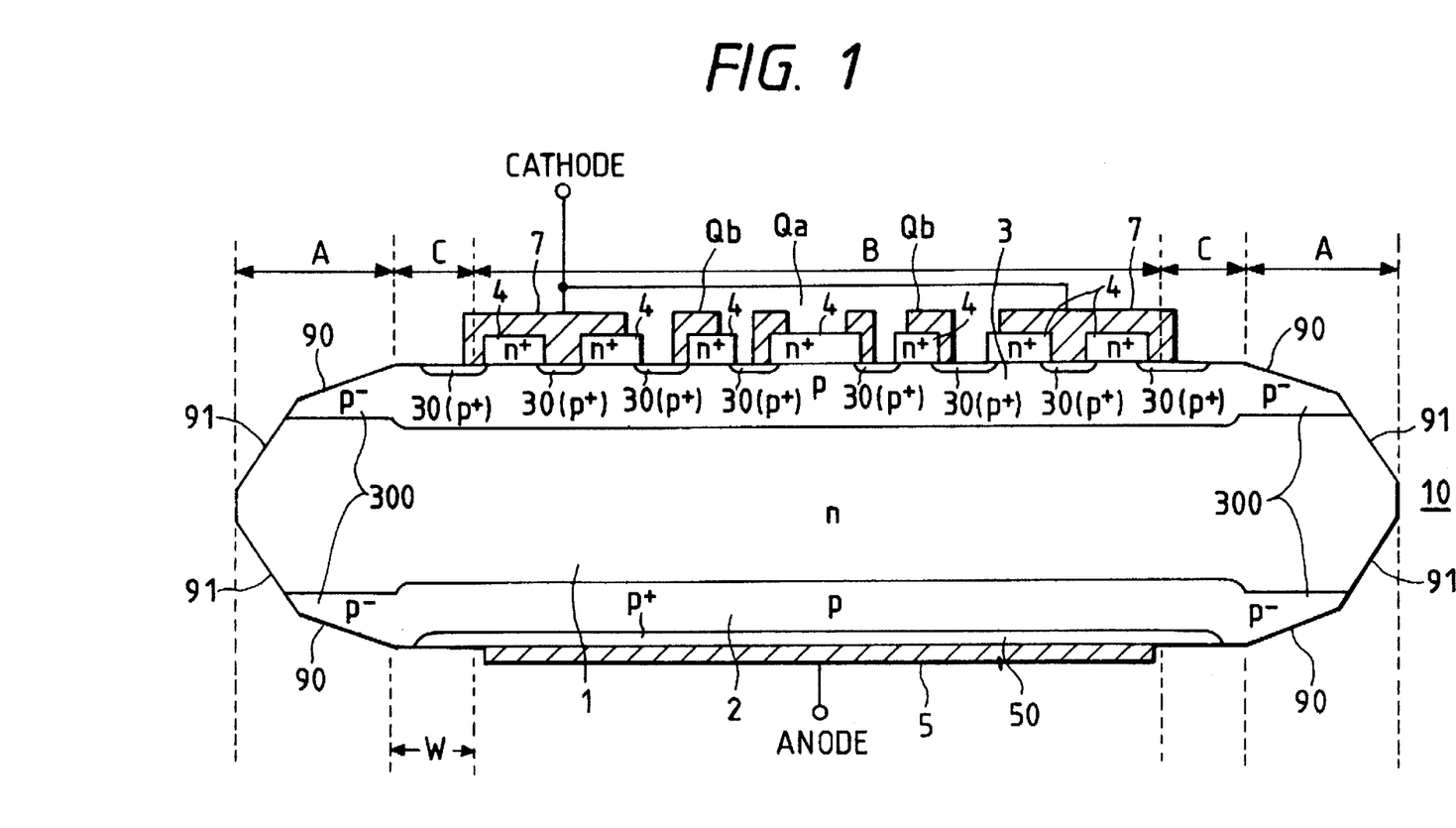
FIG. 1 is a cross sectional view showing a structure of a light activated thyristor according to one embodiment of the present invention.

FIG. 1 is a cross sectional view showing the structure of a light activated thyristor according to one embodiment of the present invention. In a semiconductor base substrate 10, a region B (second region) indicates a thyristor region composed of a pnpn four-layered structure. Regions A (first regions) respectively indicate junction terminal or end regions each composed of a pnp three-layer structure and where pn junctions are exposed. Regions C respectively indicate parasitic channel preventive regions each composed of a pnp three-layer structure.

Referring to FIG. 1, a symbol $Q_a$ in the region B indicates a trigger thyristor portion and symbols $Q_b$ in the region B indicate auxiliary thyristor portions. Other portions (on the external side of $Q_b$) in the region B indicate main thyristor portions. A p base layer 3 is partially exposed within the plane of an n emitter layer 4 (n+) in the trigger thyristor portion $Q_a$. The exposed portions serve as light-input receiving portions for trigger. The n emitter layer 4 (fourth semiconductor layer) has dottedly-deleted regions flatly provided on a somewhat regular basis. The p base layer 3 (third semiconductor layer) is exposed to a cathode surface at each deleted portion so as to be connected to each cathode electrode 7 (second main electrode). Namely, the n emitter layer 4 and the p base layer 3 are partially short-circuited. This will be generally called a "shorted emitter structure."

High-density layers 30 (fifth semiconductor layers) each of which is of p type and has an impurity density greater than the maximum impurity density of the p base layer 3, are provided at portions of the p base layer 3, which are connected to the cathode electrode 7, so that an electrical low resistance contact (ohmic contact) is achieved. A high-density layer 50, which is of the p type and has an impurity density greater than the maximum impurity density of a p emitter layer 2, is stacked on an anode surface of the p emitter layer 2 (first semiconductor layer) so as to be electrically connected to an anode electrode 5 (first main electrode). Incidentally, a region defined by the anode electrode 5 and the cathode electrode 7 will be defined as a thyristor region in which a main current flows.

In the junction end regions A, side faces, at which a pn junction is exposed, have shapes inclined toward the pn junction. In the present embodiment, two surfaces, whose inclined angles relative to a pn-junction surface differ from each other, are formed. Each of the inclined surfaces 91 is formed by a surface having a substantially inclined angle of 45 degrees, whereas each of inclined surfaces 90 is formed by a surface having a very gentle inclined angle of 1 degree or so. It is however necessary that an inclined angle most suitable for each inclined surface 91 is determined from inclined angles ranging from 30 degrees to 55 degrees so as to correspond to an impurity density of each p type semiconductor layer 300. An inclined angle most suitable for each inclined surface 90 is determined from inclined angles ranging from 0.5 degree to 2.0 degrees so as to correspond to each impurity density thereof. Further, the inclined surfaces have shapes substantially symmetrical about the n base layer 1 (second semiconductor layer) as seen in the direction from the anode surface to the cathode surface.

The p type semiconductor layer 300 having gentle inclined surfaces formed thereon is of a semiconductor layer whose impurity density is lower than the impurity densities of the p base layer 3 and p emitter layer 2 in the thyristor region B. In the present embodiment, an average impurity density of the region from the surface of the p type semiconductor layer 300 to the pn junction is lower than that of the region from the surfaces of the p base layer 3 and p emitter layer 2 of the region B to the pn junction at any portion of the regions A.

The parasitic channel preventive regions C exist between the regions B and the regions A respectively. The p base layer 3 and p emitter layer 2 in each region B extend to the region C and the region C is made up of a pnp structure. The surfaces of the regions C are respectively formed so as to extend in parallel to the anode and cathode surfaces of the region B and are respectively separated from the inclined surfaces of the regions A. Further, p type high-density layers 30 and 50 having high impurity densities are formed on both the anode and cathode surfaces.

The high-density layers 30 and the n emitter layers in the region B adjacent to the regions C are short-circuited by the cathode electrode. Thus, since the efficiency of injection of carriers from each n emitter layer is lowered, the sensitivity of triggering of a thyristor portion between the cathode electrode and the anode electrode through the n emitters adjacent to the regions C and the regions A becomes low. Therefore, no mistriggering occurs in the present embodiment even if the p type semiconductor layer 300 whose impurity density is low is provided. Accordingly, the present embodiment can lower the impurity density of each p type semiconductor layer 300 at the junction end region and improve the blocking voltage thereof without taking into consideration such a mistriggering problem. In the regions C, the anode electrode does not make contact with the high-density layer 50 and the cathode electrode is brought into contact with parts of the high-density layers 30. Owing to such an electrode construction, the effective thickness of the thyristor portion becomes large and hence the present thyristor portion is harder to mistrigger.

Further, in the present embodiment, the high-density layers 30 and 50 also serve as channel stoppers when inversion layers are formed on the surfaces extending from the regions A to the regions C. Incidentally, the width w of each region C may preferably be set so as to become greater than a diffusion length of minority carriers in the n base layer 1. Since no current flows into each region A upon conduction owing to such a width, heat can be prevented from being generated in the regions A. Thus, the device can be prevented from breakdown that occurs due to the generated heat in the regions A at which heat discharge characteristics are poor and thermal resistances are large.

Operations and effects of the present embodiment will hereinafter be described in further detail.

Figure 2:
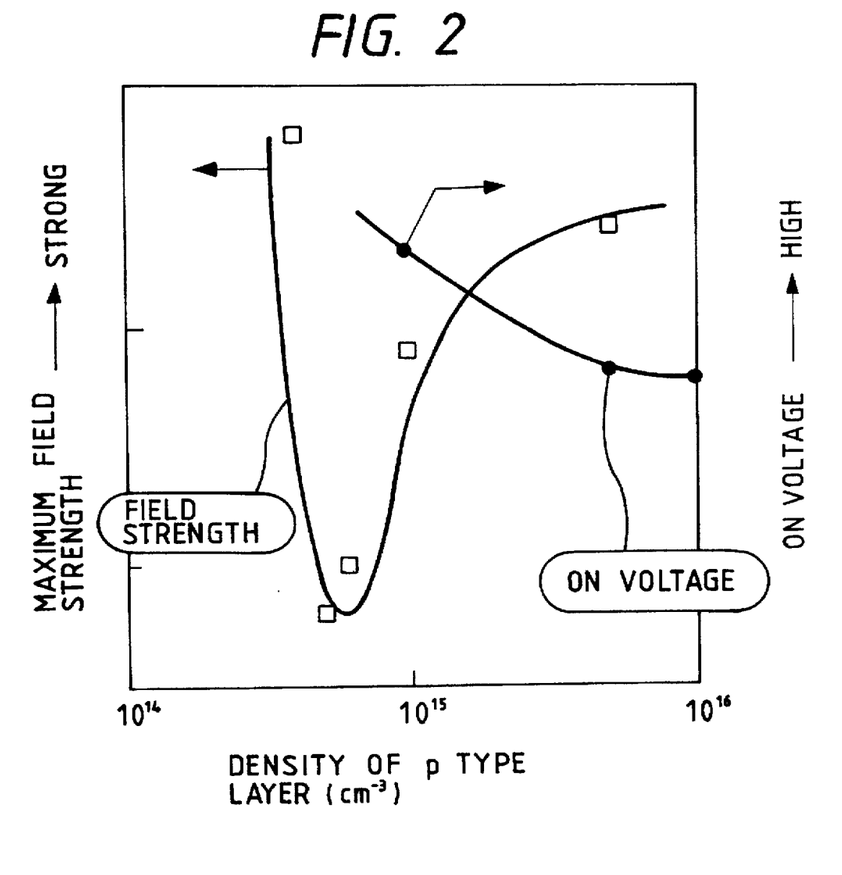
FIG. 2 is a graph for describing the relationship between an impurity density and an electrical characteristic of a p type layer provided on the cathode side.

FIG. 2 shows a result obtained by a discussion by the present inventors concerning the relationship between an impurity density and an electrical characteristic of the p type layer provided on the cathode side, which is formed in a thyristor having the structure employed in the embodiment shown in FIG. 1. An ON voltage is shown as a result of the average impurity density of the p base layer 3 in the region B being changed. The maximum field strength is represented as a result obtained while the impurity density of the p type semiconductor layer 300 in each region A is changed.

The ON voltage decreases as the impurity density of the p base layer 3 increases. In regard to the maximum field strength on the other hand, a minimum value of field strength is obtained at a certain value of the impurity density of the p type semiconductor layer 300. The states of changes in ON voltage and field strength with respect to the density of the p type layer on the cathode side differ from each other in this way. It is thus necessary to independently adjust the impurity densities of the p type layer with respect to the ON voltage and the field strength, in order to reduce both the ON voltage and the field strength and provide a high blocking voltage and a large current while reducing both the ON voltage and the field strength. Since the impurity density of the p type semiconductor layer in each region A is set so as to become lower than that of the p base layer in the region B in the embodiment shown in FIG. 1, the field strength can be set to a value close to the minimum value and the ON voltage can be lowered. Namely, the present embodiment can combine a high blocking-voltage characteristic with a large current characteristic.

According to the discussions of the present inventors, it is necessary to set the impurity density of each p type semiconductor layer 300 in the region A to a low density of at least the order of $10^{14}$ cm$^{-3}$ from the viewpoint of the field strength. Since a layer having such a low density is exposed on the surface of the p type semiconductor layer 300 in each region A, the surface is easily inverted into an n type even if a slight amount of contamination occurs. Since the high-density layers 30 and 50 (p+) are provided in the regions C in the embodiment shown in FIG. 1, these semiconductor layers serve as inversion preventive layers (channel stoppers) even if the surface of each p type semiconductor layer 300 is inverted. Accordingly, it is possible to prevent the n inversion layer from reaching the n emitter layer 4 or the anode electrode 5, and leakage current increase prevented.

Further, since the high-density layers 30 in the regions C reduce the efficiency of injection of carriers into each n emitter layer 4, the sensitivity of triggering of a parasitic thyristor formed in a portion that extends by way of or via a side-wall region of each region A from the n emitter layer 4 is reduced. Therefore, the p type semiconductor layers 300 and the p base layer 3 in the region B can be optimized independently of each other without considering a parasitic thyristor effect.

The p type high-density layer 50 increases the injection efficiency of the p emitter layer and contributes to an increase in current-carrying capacity at the time of an ON-state of the thyristor region B. However, the high-density layer 50 increases the leakage current that flows in an OFF state of the thyristor region B. Each of the regions A is a region which is concerned in the OFF state thereof alone. There is a case in which the increase in leakage current in the region A causes a failure of the semiconductor device. The thyristor device according to the present invention is normally assembled and activated in a state in which the anode and cathode surfaces are pressed through an internal buffer composed of a molybdenum or tungsten member. It is however necessary to normally apply an organic resin such as silicon rubber or the like to side faces (corresponding to the regions A) of a semiconductor substrate of a high blocking-voltage semiconductor device, which have pn junctions exposed from thereabove, and to protect the applied side faces. Further, the pressure cannot be applied to the side faces. Therefore, thermal resistances of the regions A become so greater than those of other portions and a slight increase in leakage current causes thermal runaway, thereby destroying the device. Since the p type high-density layer is not provided within the regions A, the leakage current is reduced and thermal runaway will hardly occur, whereby high reliability is obtained.

A method of manufacturing the thyristor according to the present embodiment will now be described with reference to FIGS. 3 through 11.

Figure 3:
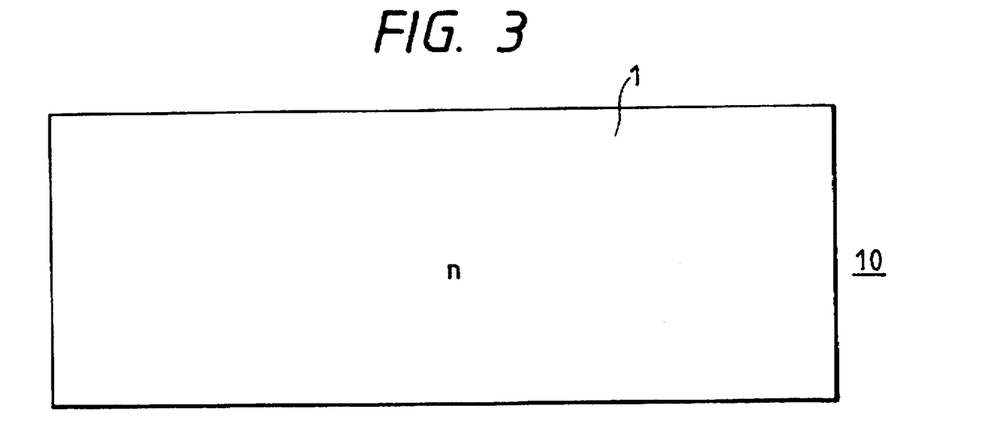
FIG. 3 is a graph for describing a method of manufacturing the thyristor according to the embodiment shown in FIG. 1.

As shown in FIG. 3, an n-type silicon semiconductor base substrate 10, whose resistivity and thickness are 550 Ω·cm and 1,600 µm respectively, is first prepared.

Figure 4:
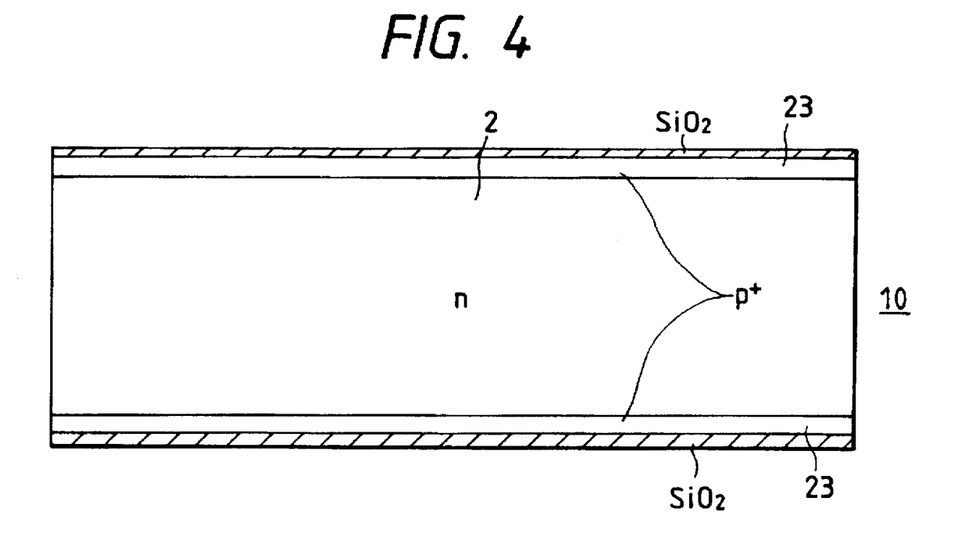
FIG. 4 is a diagram for describing the method of manufacturing the thyristor according to the embodiment shown in FIG. 1.

As shown in FIG. 4, aluminum corresponding to p type impurities is next diffused from both main surfaces of the n-type semiconductor base substrate 10 by a vapor diffusion process. Further, silicon oxide films (SiO$_2$) each having a thickness of 0.5 µm are respectively formed on the surfaces by a thermal oxidation process.

Figure 5:
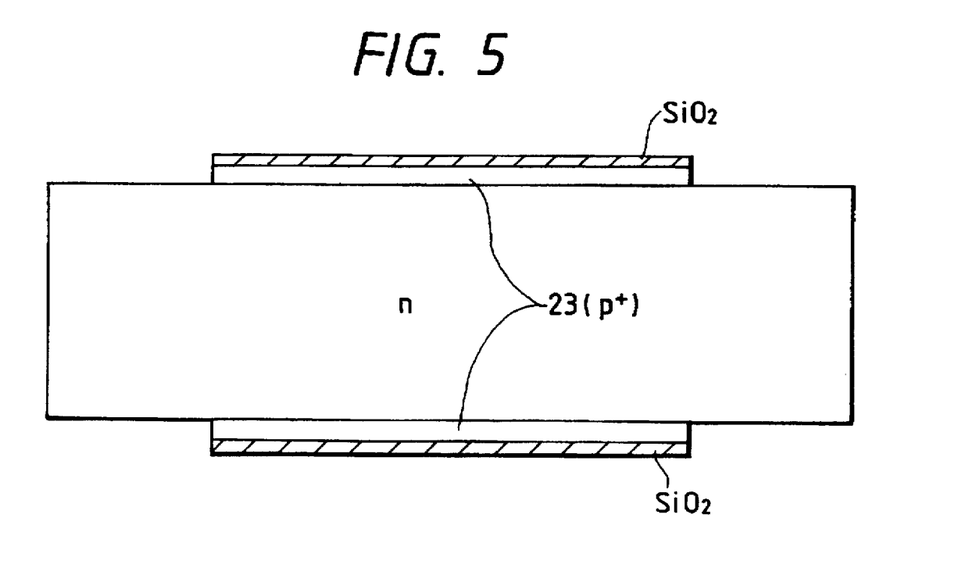
FIG. 5 is a diagram for describing the method of manufacturing the thyristor according to the embodiment shown in FIG. 1.

Next, the silicon oxide films provided at the peripheral portions of the semiconductor base substrate 10 are etched using masks with photo resists as shown in FIG. 5. Subsequently to this processing, the surfaces of the silicon substrates are eliminated by a dry etching process using the patterned silicon oxide films as masks. At this time, etching is performed so as to reach such a depth that each of the aluminum diffusion layers 23 is removed. In the present embodiment, the depth to be etched is about 10 µm.

Figure 6:
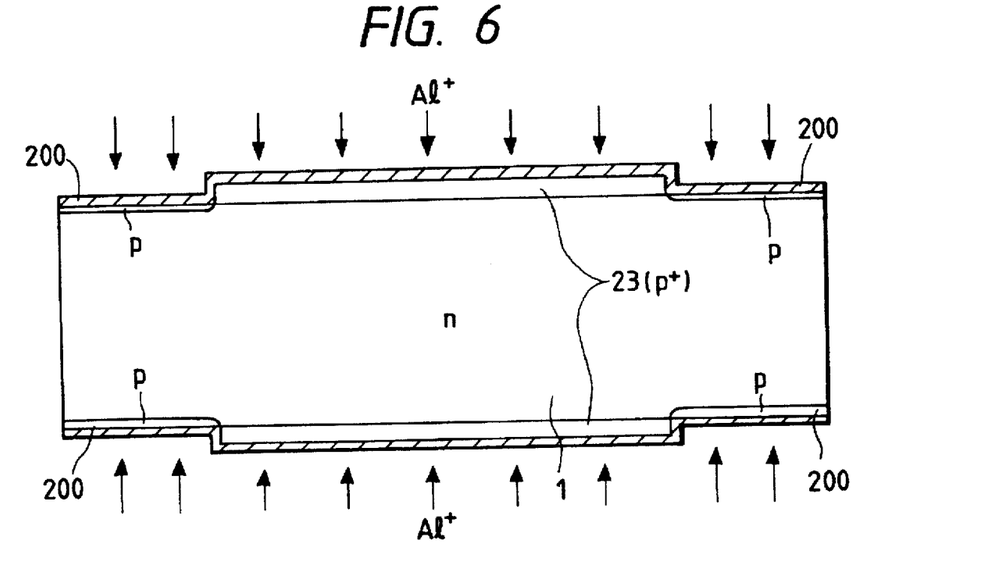
FIG. 6 is a diagram for describing the method of manufacturing the thyristor according to the embodiment shown in FIG. 1.

The silicon oxide films are next formed on the entire main surfaces of the semiconductor base substrate base 10 again as shown in FIG. 6. Aluminum ions are then ion-implanted in both main surfaces of the semiconductor substrate 10. Conditions for their implantation are as follows: acceleration voltages ranging from 500 KeV to 8,000 KeV and doses ranging from $1\times10^{14}$ cm$^{-2}$ to $5\times10^{15}$ cm$^{-2}$. At this time, p type semiconductor layers 200 are formed at the peripheral portions of the semiconductor base substrate 10. The high-density aluminum diffusion layers already formed by the vapor diffusion process exist in the center of the semiconductor base substrate 10 and the dose ranging from $1\times10^{14}$ cm$^{-2}$ to $5\times10^{15}$ cm$^{-2}$ has little effect on the entire amount of aluminum. Further, the impurity densities of the p type semiconductor layers 200 can be arbitrarily adjusted by varying the dose.

Figure 7:
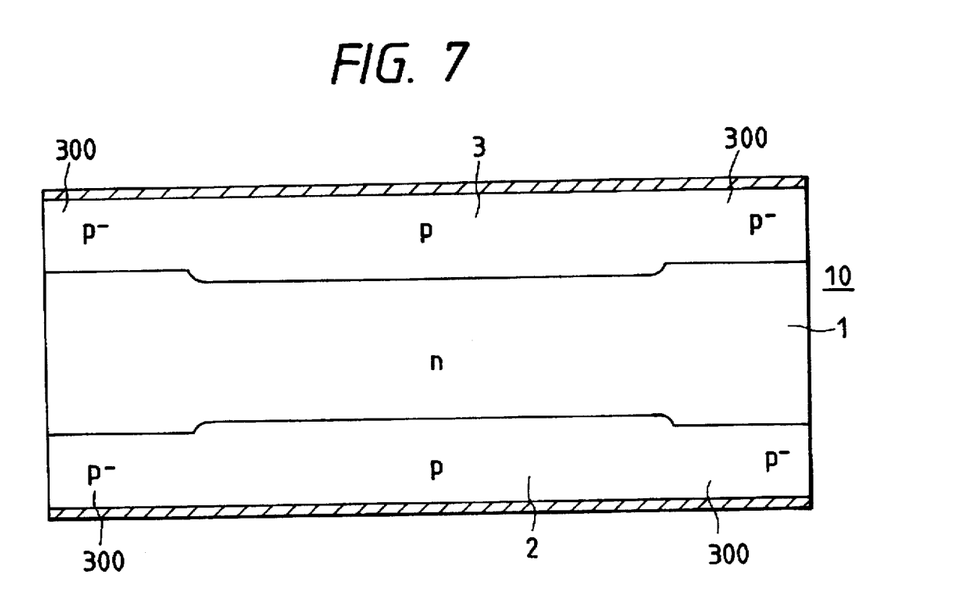
FIG. 7 is a diagram view for describing the method of manufacturing the thyristor according to the embodiment shown in FIG. 1.

Next, aluminum is diffused under a heat treatment (drive-in) of 1,250° C. as shown in FIG. 7 to form a p emitter layer 2, a p base layer 3 and p type semiconductor layers 300 each of which has a predetermined depth.

Figure 8:
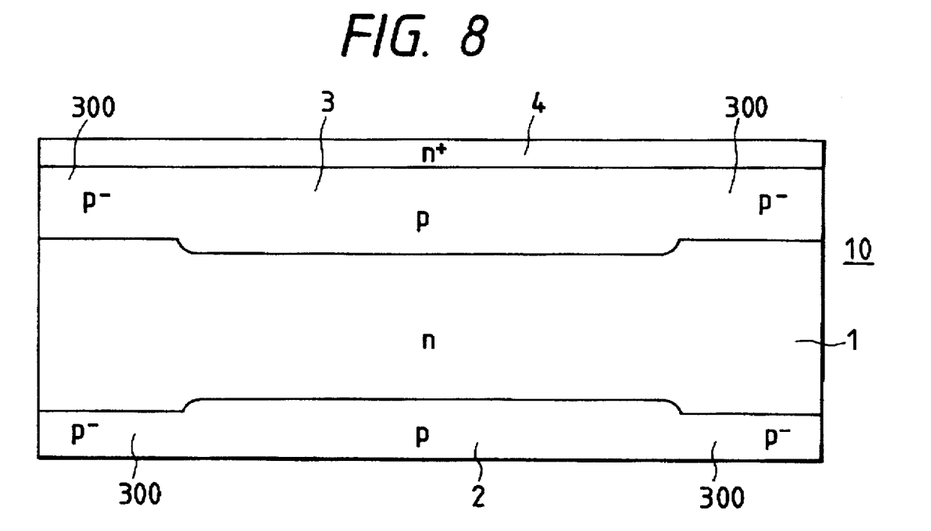
FIG. 8 is a diagram for describing the method of manufacturing the thyristor according to the embodiment shown in FIG. 1.

Thereafter, as shown in FIG. 8, the thickness of a p type impurity layer on the cathode side, which is formed as the p base layer 3, is adjusted by etching so that the sheet resistivity of a sheet under the final n emitter layer falls within resistances ranging from 200 Ω/□ to 500 Ω/□ in a final step of the manufacturing the proccess. At this time, each peripheral p type impurity layer 300 has the sheet resistivity range of from 700 Ω/□ to 3,000 Ω/□. Thereafter, n type impurity phosphorus is diffused over the entire main surfaces of the semiconductor base substrate 10 to form n+ type diffusion layers (4). Further, the n+ type diffusion layers on the anode surface are removed and the n+ type diffusion layers are left only on the cathode surface.

Figure 9:
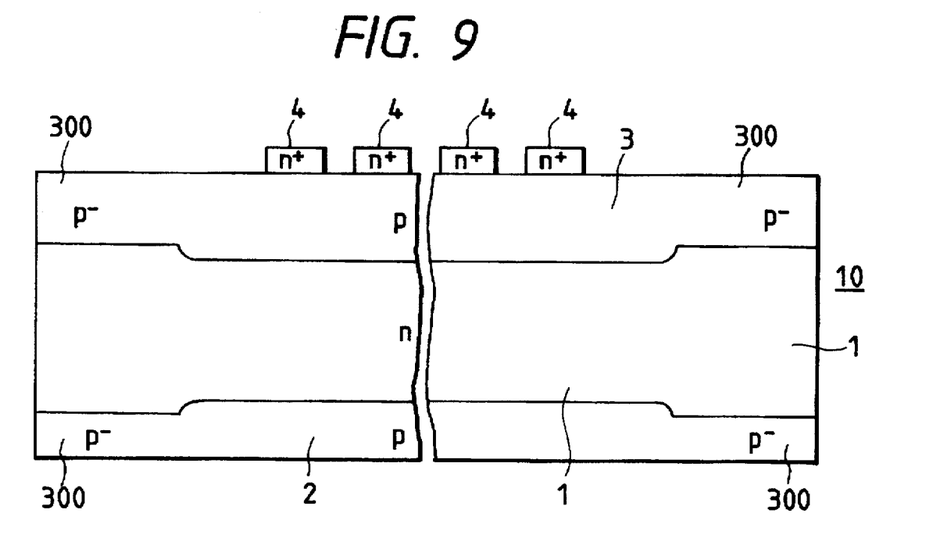
FIG. 9 is a diagram for describing the method of manufacturing the thyristor according to the embodiment shown in FIG. 1.

As shown in FIG. 9, the n+ type diffusion layers (4) are next processed into predetermined flat patterns to form n emitter layers 4.

Figure 10:
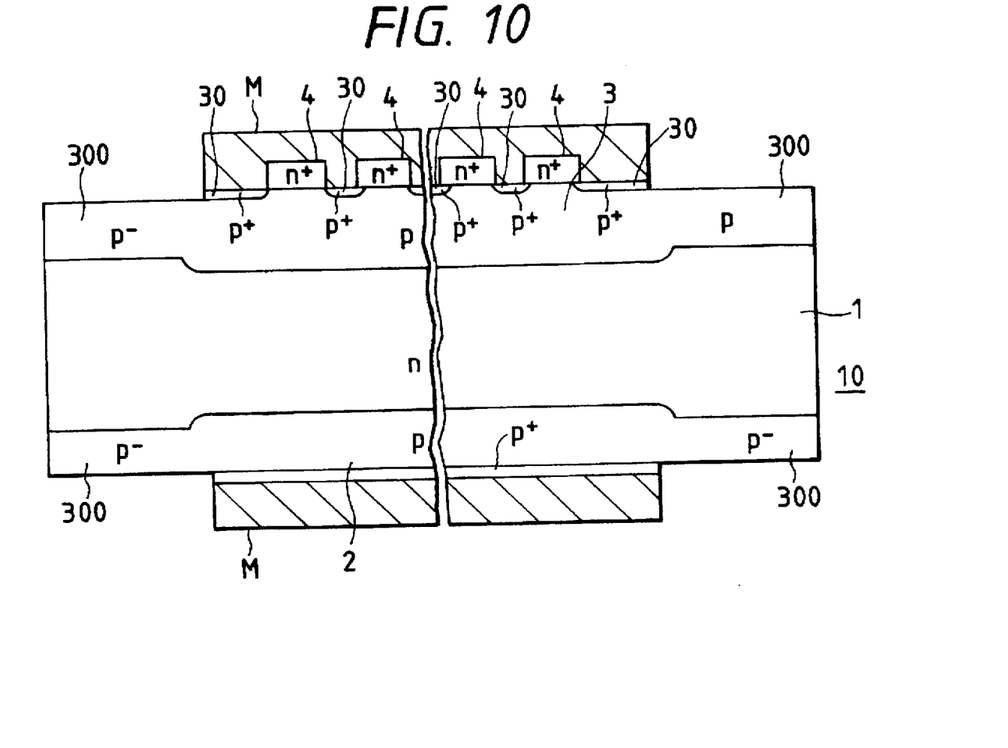
FIG. 10 is a diagram for describing the method of manufacturing the thyristor according to the embodiment shown in FIG. 1.

As shown in FIG. 10, p type high-density layers 30 and 50 each having a depth of 10 μm are next formed on both main surfaces of the semiconductor base substrate 10 by aluminum having a density of $10^{18}$ cm$^{-3}$ per unit volume. Thereafter, the regions B and C are covered with photo resists M and the high-density layers 30 and 50 formed within the regions A are removed by etching.

Figure 11:
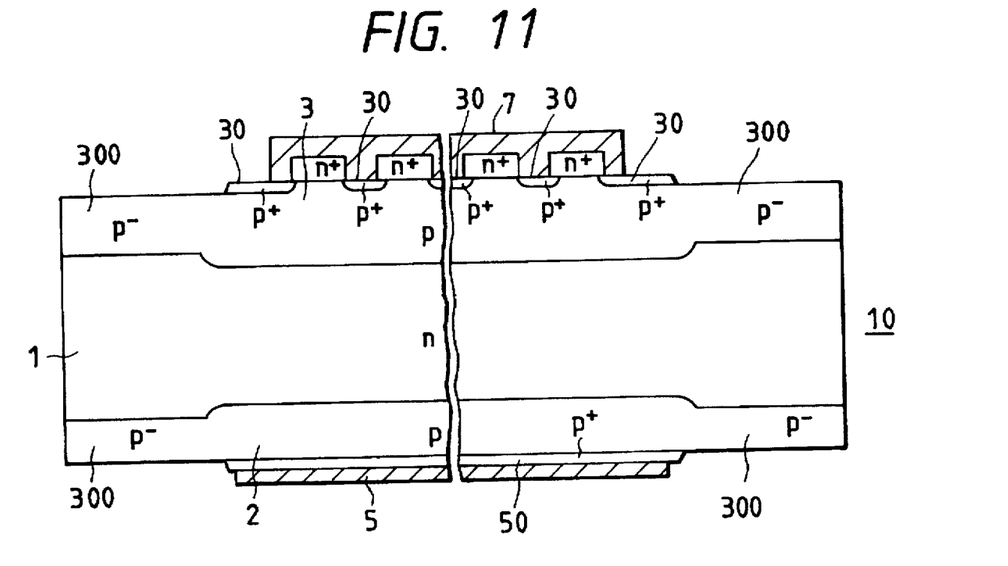
FIG. 11 is a diagram for describing the method of manufacturing the thyristor according to the embodiment shown in FIG. 1.

Finally, aluminum is evaporated onto both main surfaces of the semiconductor base substrate 10 and the resultant aluminum films on the anode and cathode surfaces are processed so as to be brought into predetermined flat patterns as shown in FIG. 11 by using photo resists. Thereafter, the shapes of end faces of the semiconductor base substrate 10 are processed and formed to complete the thyristor shown in FIG. 1.

(Embodiment 2)

Figure 12:
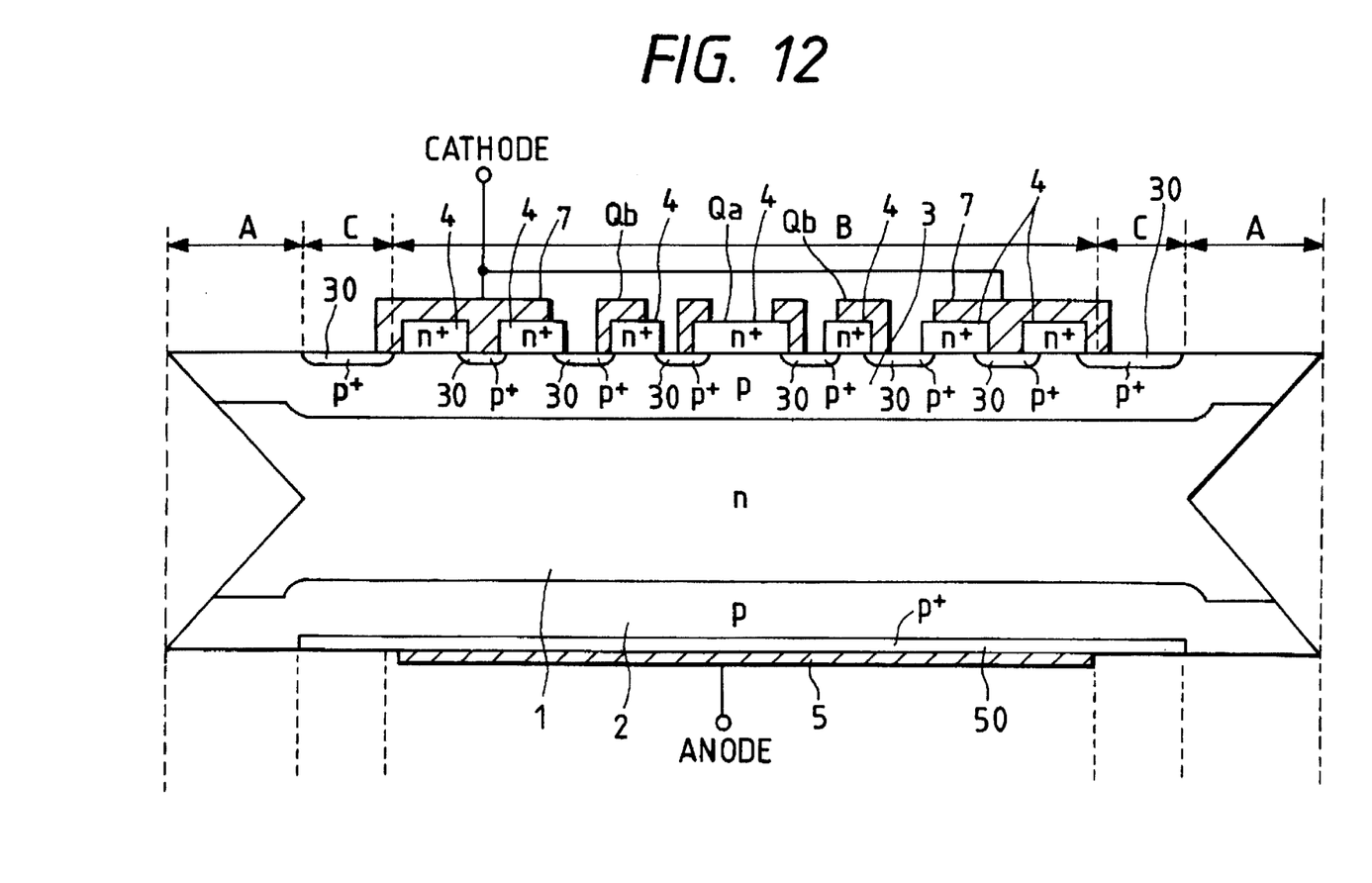
FIG. 12 is a cross sectional view showing a structure of a light activated thyristor according to another embodiment of the present invention.

FIG. 12 is a cross sectional view showing a structure of a light activated thyristor according to another embodiment of the present invention.

The present embodiment is different from the aforementioned embodiment in that the shapes of the side faces from which two pn junctions are exposed at junction end regions A, are formed at so-called positive bevels. Now, each of the positive bevels exhibits a slant or inclination providing a shape whose sectional area increases from a layer of semiconductor layers interposing each pn junction, which has a lowered impurity density, to a layer thereof having a high impurity density. Since the inclined angle can be set to 45 degrees or so in the case of the positive bevel, each junction end region A can be reduced in width. Thus, a thyristor region B can be broadened correspondingly and a larger current flow can be achieved.

(Embodiment 3)

Figure 13:
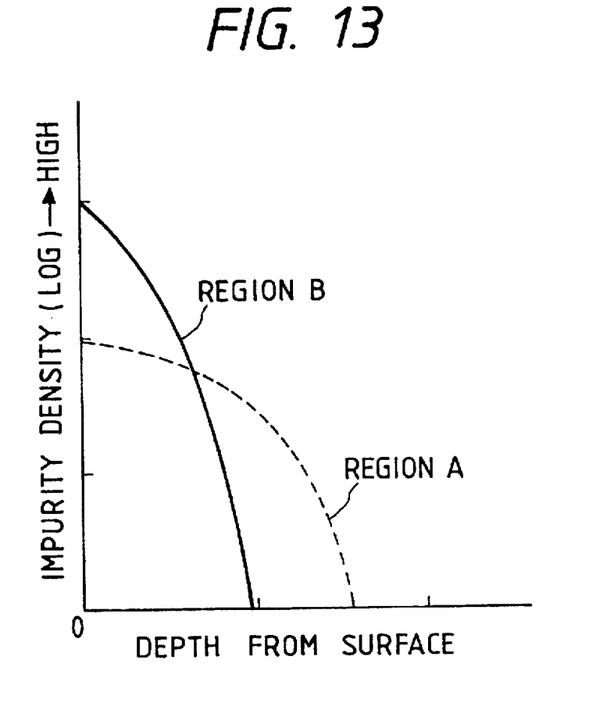
FIG. 13 is a graph for describing impurity density distributions of a p base layer and a p type semiconductor layer employed in the light activated thyristor shown in FIG. 12.

FIG. 13 is a view for describing impurity density distributions of a p base layer and a p type semiconductor layer employed in a light activated thyristor according to a further embodiment of the present invention. In the present drawing, a curve indicated by a solid line and a curve indicated by a broken line, respectively, represent a density distribution of a p base layer in a region B and a density distribution of a p type semiconductor layer in each region A. Both layers are formed by thermal diffusion after p type impurities have been ion-implanted in a semiconductor base substrate. In the present embodiment, in contrast to the aforementioned embodiments, the p base layer in the region B is formed so as to become shallower than the p type semiconductor layer in each region A. However, the dose of ion implantation is set so that an average impurity density of the p base layer in the region B is larger than that of the p type semiconductor layer in each region A.

According to the discussions of the present inventors, when a 8 kV-level light activated thyristor is used, it is preferable for boron to be used as an impurity for the p base layer in the region B, for the surface density thereof to be set to $10^{16}$ cm$^{-3}$ and for the sheet resistivity thereof to be set to about 300 Ω/□, and aluminum is used as an impurity for the p type semiconductor layer in each region A, the surface density thereof being set to $10^{15}$ cm$^{-3}$ and the sheet resistivity thereof being set to about 1,000 Ω/□. When the present embodiment is manufactured, deposition using thermal diffusion may be used in place of ion implantation.

While the embodiments of the present invention have been described above in detail, various modifications can be made within the technical scope of the invention as well as modifications of the structures of the embodiments. For example, the impurity density distribution of the p base layer 3 may not be identical to that of the p emitter layer 2. The impurity density distributions of the p type semiconductor layers 300 may be dissimilar to one another on the anode and cathode sides. Further, the bevel structure is not necessarily limited to the one described above. Various bevel structures can be used.

If the p base layer at the light-input receiving portions for trigger is partially lowered in density and the sheet resistivity is increased (e.g., 1,000 Ω/□) in the light activated thyristor to which the present invention is applied, the resistance of a region in which a photoelectric current flows increases. Therefore, the n emitter at the trigger thyristor portion can be sufficiently biased even if the receiving portions are reduced in area.

Incidentally, the present invention can be applied to a normal electric thyristor or a gate turn-off thyristor (GTO) as well as to a light activated thyristor.

According to the present invention, both the blocking voltage and current capacity for a high blocking-voltage semiconductor device can be increased.

What is claimed is:

1. A semiconductor device comprising:
a semiconductor base substrate having a first conductivity type first semiconductor layer, a second conductivity type second semiconductor layer located on the first semiconductor layer, a first conductivity type third semiconductor layer located on the second semiconductor layer and a second conductivity type fourth semiconductor layer located on the third semiconductor layer, the semiconductor base substrate including a first region adjacent to an end of said semiconductor base substrate and a second region provided inside the first region;

a first main electrode provided on the first semiconductor layer; and a second main electrode provided on the fourth semiconductor layer, said third semiconductor layer in the first region having an average impurity density smaller than that of the third semiconductor layer in the second region, and said second main electrode being in contact with the third semiconductor layer between the first and second regions, wherein a parasitic channel preventive region is provided between the first and second regions, the parasitic channel preventive region having a width greater than or equal to a diffusion length of a minority carrier in the second semiconductor layer.

2. A semiconductor device according to claim 1, wherein the first region has a bevel structure.

3. A semiconductor device according to claim 1, wherein the average impurity density of the third semiconductor layer in the first region is approximately $10^{14}$ cm$^{-3}$.

4. A semiconductor device according to claim 1, wherein a surface impurity density of the third semiconductor layer is approximately $10^{16}$ cm$^{-3}$ in the first region and approximately $10^{16}$ cm$^{-3}$ in the second region.

5. A semiconductor device according to claim 1, wherein a sheet resistivity of the third semiconductor layer is about 1,000 Ω/□ in the first region and about 300 Ω/□ in the second region.

6. A semiconductor device according to claim 2, wherein a side face of the first region has two portions at which two pn-junctions are exposed, and wherein the bevel structure has a positive bevel in each of said two portions.

7. A semiconductor device comprising:

a semiconductor base substrate having a first conductivity type first semiconductor layer, a second conductivity type second semiconductor layer located on the first semiconductor layer, a first semiconductor type third semiconductor layer located on the second semiconductor layer and a second conductivity type fourth semiconductor layer located on the third semiconductor layer, the semiconductor base substrate including a first region adjacent to an end of said semiconductor base substrate and a second region provided inside the first region;

a first main electrode provided on the first semiconductor layer; and a second main electrode provided on the fourth semiconductor layer, said third semiconductor layer in the first region having an average impurity density smaller than that of the third semiconductor layer in the second region, and said second main electrode being in contact with the third semiconductor layer between the first and second regions, wherein a parasitic channel preventive region is provided between the first and second regions, and wherein a first conductivity type fifth semiconductor layer having an impurity density higher than that of the first region is provided on the surface of the third semiconductor layer in the parasitic channel preventive region.

8. A semiconductor device according to claim 7, wherein said second main electrode makes contact with the fifth semiconductor layer.

9. A semiconductor device according to claim 7, wherein the first region has a bevel structure.

10. A semiconductor device according to claim 9, wherein a side face of the first region has two portions at which two pn-junctions are exposed, and wherein the bevel structure has a positive bevel in each of said two portions.

11. A semiconductor device according to claim 10, wherein said second main electrode makes contact with the fifth semiconductor layer.

12. A semiconductor device according to claim 9, wherein said second main electrode makes contact with the fifth semiconductor layer.

* * * * *